PULSE WIDTH MODULATED LASER

Filed Oct. 14, 1966

Inventor:
Gunther E. Fenner,
by Marvin Snyder
His Attorney.

United States Patent Office 3,478,280
Patented Nov. 11, 1969

3,478,280
PULSE WIDTH MODULATED LASER

Gunther E. Fenner, Schenectady, N.Y., assignor to General Electric Company, a corporation of New York Filed Oct. 14, 1966, Ser. No. 586,687
Int. Cl. G01s 3/10
U.S. Cl. 332—7.51 7 Claims

ABSTRACT OF THE DISCLOSURE

An apparatus for producing pulse width modulated coherent optical output pulses from a semiconductor junction laser in which the pulse width modulation is achieved by adjusting the turn-on delay of the semiconductor junction laser; in one embodiment this is achieved by applying amplitude modulated pulses of constant width to the semiconductor junction laser and in another embodiment by applying modulation and bias currents to the semiconductor junction laser below the threshold of lasing and exceeding the threshold of lasing by the application of constant amplitude and width pulses.

This invention relates to modulating systems, and more particularly to a system for electronically modulating width of output pulses produced by a semiconductor junction laser.

Semiconductor junction lasers, such as the type disclosed and claimed in R. N. Hall Patent No. 3,245,002, issued Apr. 5, 1966, and assigned to the instant assignee, enable efficient emission of stimulated coherent electro-magnetic radiation, such as light, utilizing relatively simple apparatus. In many applications of such lasers, which are also known as injection lasers, modulation of the coherent radiation is necessary in order to transmit information on the laser beam. One system for modulating radiation produced by a semiconductor junction laser is shown and described in G. E. Fenner application, Ser. No. 399,053, filed Sept. 24, 1964, and assigned to the instant assignee. In the aforementioned Fenner application, modulation is achieved by frequency modulating the radiation emitted by a semiconductor junction laser. The present invention concerns pulse width modulation of the radiation emitted by a semiconductor junction laser.

It has been found that almost all semiconductor junction lasers fabricated by the diffusion process, such as the type described in the aforementioned Hall patent, exhibit a turn-on delay as the ambient temperature of the laser is increased to room temperature levels. This delay is believed to be due to optical absorption by the semiconductor material, which increases with temperature. Moreover, the delay is current dependent; that is, an increase in current tends to diminish the delay. At low temperatures, dimunution of the delay with an increase in current is greater than at room temperatures. Although this delay has been heretofore considered to be an undesirable feature of semiconductor junction lasers, the instant invention utilizes this phenomenon for achieving pulse width modulation.

When a current of predetermined amplitude is applied to the laser, stimulated emission of radiation eventually occurs. It is believed that this predetermined amplitude is dependent upon the number of traps in the semiconductor material; that is, these traps, which would otherwise absorb photons generated near the laser junction along the active region, are filled by the injection electrons. This absorption of photons effectively keeps stimulated emission from building up until most of the trapping centers have first been filled. If the injected current is thereafter maintained at the same or greater amplitude, stimulated emission occurs. Hence, by controlling amplitude of this current, the length of time required to reach the point at which most of the trapping centers have been filled is accordingly controlled. Thus, the interval between initiation of current and occurrence of stimulated emission resulting therefrom is controllable in accordance with amplitude of applied current, conveniently enabling pulse width modulation to be achieved. Because this effect is more pronounced at room temperature levels than at cryogenic temperature levels, the instant invention is preferably practiced at room temperature levels.

To produce stimulated coherent emission from an injection laser, current supplied thereto must be of sufficient amplitude to exceed a threshold value, herein designated the threshold of lasing, below which coherent radiation does not occur. This threshold value, which represents the minimum current amplitude at any given time required to produce lasing at that time, and the existence of which is recognized in the aforementioned Hall patent, is dependent on duration of the applied current, as described above. Thus, if the current pulse amplitude is increased, stimulated emission occurs earlier in the pulse interval; conversely, if the current pulse amplitde is decreased, stimulated emission occurs later in the pulse interval.

Pulse width modulation in the instant invention, therefore, is achieved in one embodiment by varying the amplitude of pulses supplied to the semiconductor junction laser since, by varying the amplitude of these driving pulses, the turn-on delay of the laser is varied. Because radiation ceases upon cessation of each driving pulse, the laser output signal comprises a train of pulses of coherent electromagnetic radiation. Thus, by adjusting the turn-on delay of the laser, the width of optical output pulses may be adjusted.

Accordingly, one object of this invention is to provide a method and apparatus for pulse width modulating output radiation of a semiconductor junction laser.

Another object is to provide a turn-on delay for each output pulse of an injection laser wherein the delay is variable in accordance with a modulating signal.

Another object is to provide a modulation converter for changing amplitude modulated current pulses into width modulated coherent optical pulses.

Briefly, in accordance with a preferred embodiment of the invention, there is provided apparatus for width modulating coherent optical output pulses of a semiconductor injection laser comprising means coupling a train of constant amplitude driving pulses to the laser, the amplitude of each driving pulse exceeding the threshold level required to produce lasing at a predetermined instant in the respective pulse interval. Modulation is accomplished by means coupling a modulating signal to the laser in order that the laser be driven by pulses algebraically added to the modulating signal.

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

Figure 1:
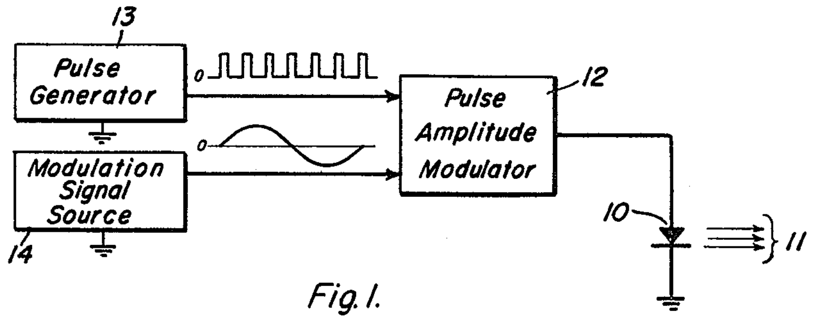
FIGURE 1 is a schematic diagram of a system for width modulating coherent optical output pulses of a laser by driving the laser with amplitude modulated current pulses.

In FIGURE 1, a semiconductor junction laser 10 is shown emitting coherent optical energy 11 in response to an output signal from a pulse amplitude modulator 12. Pulse amplitude modulator 12 receives constant amplitude clock pulses from a pulse generator 13 and a modulation signal from a modulation signal source 14. Each clock pulse is sufficient amplitude to exceed the threshold required by injection laser 10 to produce lasing as a predetermined instant in the respective pulse interval.

While laser 10, which is fabricated by the diffusion process, may be comprised of various direct transition semiconductor materials, a laser preferable for operation with the apparatus of FIGURE 1 is of the type comprised of gallium arsenide. Such lasers are completely described in the aforementioned Hall patent.

Figures 2A, 2B:
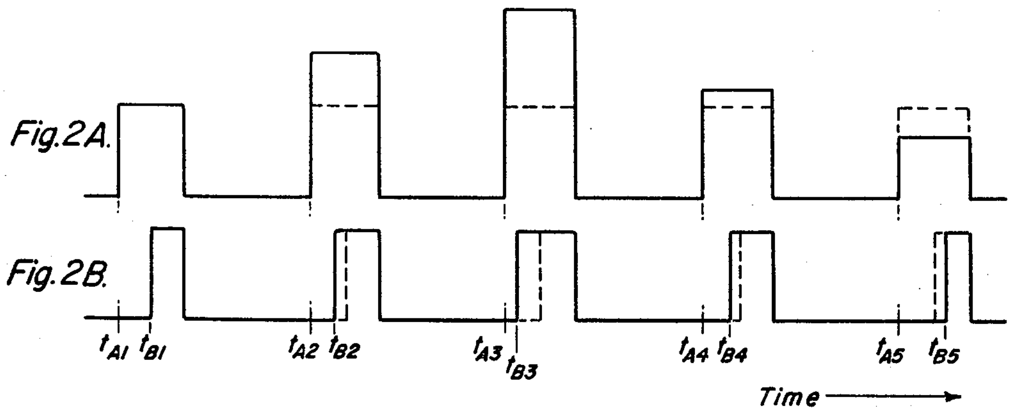
FIGURES 2A and 2B are graphical illustrations to aid in explaining operation of the system of FIGURE 1.

As shown in FIGURE 1, laser 10 receives pulses of waveform illustrated in FIGURE 2A from pulse amplitude modulator 12. The pulses supplied by modulator 12 are produced as a constant repetition rate, and are of constant width. Although the pulses produced by pulse generator 13 are of constant amplitude equal to that of the unmodulated first pulse, as indicated by the dotted portions of each of the pulses in FIGURE 2A subsequent to the first pulse, the amplitudes of these pulses are modulated in accordance with the signal produced by modulation signal source 14. Thus, the amplitude of these pulses are adjusted to the amplitudes indicated by the horizontal solid lines of the pulses.

Because of the inherent turn-on delay of laser 10, initiation of the optical output pulse occurs at a delayed time $t_B$ following the time of initiation of the pulse $t_A$. Thus, with the first pulse, the turn-on delay is that which occurs in the absence of a modulating signal supplied to pulse amplitude modulator 12, and may be designated $(t_{B1}-t_{A1})$. Because the second pulse produced by pulse amplitude modulator 12 is greater in amplitude than the clock pulse produced by pulse generator 13 as illustrated by the first pulse in FIGURE 2A, the turn-on delay is decreased so that delay time $(t_{B2}-t_{A2})$ is less than delay time $(t_{B1}-t_{A1})$. Similarly, since the third pulse is shown as being of greater amplitude than the second pulse, time $t_{B3}$ occurs at an earlier point in time within the period of the third pulse than does time $t_{B2}$ within the period of the second pulse, making interval $(t_{B3}-t_{A3})$ less than interval $(t_{B2}-t_{A2})$.

Because the fourth pulse is only slightly greater in amplitude than the first pulse, time $t_{B4}$ occurs during the period of the fourth pulse at only a slightly earlier time than does time $t_{B1}$ in the period of the first pulse, so that interval $(t_{B4}-t_{A4})$ is slightly smaller than interval $(t_{B1}-t_{A1})$. With the fifth pulse, the amplitude of the driving pulse supplied to laser 10 is less than the amplitude of the clock pulses, due to the negative polarity of modulation impressed by modulating signal source 14 on the fifth clock pulse. As long as the modulation impressed thereon is limited to being insufficient to drive the output pulse from pulse amplitude modulator 12 below threshold, the turn-on delay is increased over that of the unmodulated pulse, so that interval $(t_{B5}-t_{A5})$ exceeds interval $(t_{B1}-t_{A1})$. Of course if the output pulse from modulator 12 were driven below threshold, the turn-on delay for that pulse would be infinite.

Therefore, it can be seen from the pulses of FIGURES 2A and 2B that an increase in amplitude of driving pulses decreases the turn-on delay of the laser, while a decrease in amplitude of driving pulses increases the turn-on delay. Hence, since a decrease in turn-on delay lengthens the duration of the optical output pulse and an increase in turn-on delay shortens the duration of the optical output pulse, pulse width modulation of the optical output pulses is achieved. Because the output of pulse amplitude modulator 12 comprises a train of amplitude modulated pulses, the circuit of FIGURE 1 may also be utilized as a modulation converter; that in, as a circuit for converting from pulse amplitude modulated current pulses to pulse width modulated coherent optical pulses.

Figure 3:
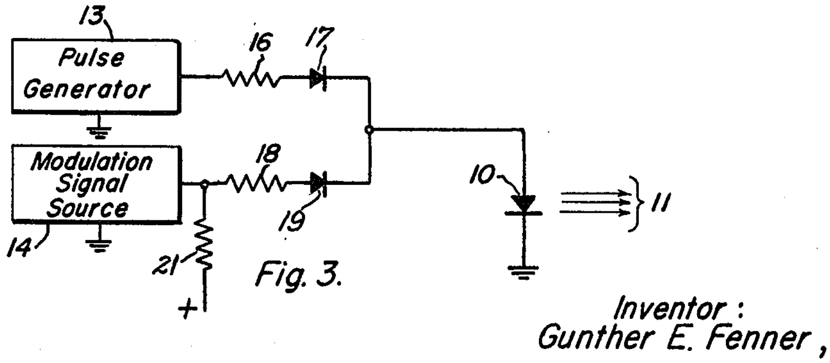
FIGURE 3 is a schematic diagram of a system for producing width modulated coherent optical output pulses from a laser by driving the laser with a train of constant amplitude current pulses and a modulation current.

In the circuit of FIGURE 3, laser 10 is shown emitting coherent light 11 in response to energization from pulse generator 13 and modulation signal source 14. However, output of pulse generator 13 is supplied to the laser through a current limiting resistance 16 in series with a forward-connected diode 17 while modulation current is supplied from source 14 through a current limiting resistance 18 in series with a forward-connected diode 19. A positive bias is supplied to the modulating signal through a current limiting resistance 21 connected to resistance 18. This bias prevents reversal of signal polarity applied to the laser by the modulating signal source between pulses when the modulating signal swings negative. Diodes 17 and 19 prevent pulse generator 13 and modulation signal source 14 from short-circuiting each other.

The signal furnished to laser 10 in FIGURE 3 is similar to that shown in FIGURE 2A, with the exception that the modulation and bias currents are present between clock pulses. This is not detrimental to operation of laser 10, provided that the maximum amplitude of combined modulation and bias current is always held below threshold. Under such conditions, traps in the semiconductor material of the laser are filled by the combined modulation current and bias current prior to occurrence of each clock pulse. The number of traps so filled is dependent upon the algebraic sum of the modulation and bias currents. Hence, when a clock pulse occurs, the threshold of lasing is exceeded either earlier or later in the cycle, depending upon whether the modulation current has added to or subtracted from the bias current respectively, than the instant at which the threshold is exceeded by a clock pulse succeeding an interval in which zero modulation current is present. Because the modulation current is applied between clock pulses, it is important that the time required for trap emptying be sufficiently small in relation to the period of the modulating signal so as to permit emptying of the traps at a rate which substantially follows the rate of each decrease in modulating current. I have found that trap emptying occurs at a much slower rate than trap filling; hence, trap emptying imposes a frequency limitation on the modulating signal. With present-day diodes, trap emptying requires an interval of approximately 50–100 nanoseconds. Thus, a modulating signal having a minimum period of approximately 0.5–1.0 microseconds, which would represent a maximum frequency of 1–2 megacycles, would be sufficiently undistorted by the trap emptying time to provide suitable modulation fidelity of the laser output pulses. With shorter trap emptying intervals, the modulation signal could be increased in frequency. Thus, the major difference between operation of the circuit of FIGURE 3 and that of FIGURE 1 resides in the fact that pulse width modulation is accomplished directly in laser 10 when used with the circuit of FIGURE 3.

The foregoing describes apparatus for pulse width modulating output radiation emitted by a semiconductor injection laser. The apparatus provides a turn-on delay for the laser which is variable in accordance with a modulation signal. In addition, the apparatus functions as a modulation converter for changing amplitude modulated current pulses into width modulated coherent optical pulses.

While only certain preferred embodiments of the invention have been shown by way of illustration, many modifications and changes will occur to those skilled in the art. It is, therefore, to be understood that the appended claims are intended to cover all such modifications and changes as fall within the true spirit and scope of the invention.

What is claimed is:

1. Apparatus for width modulating coherent optical output pulses of a semiconductor junction laser comprising means generating a train of constant amplitude and constant width driving pulses, means generating a modulating signal, and means responsive to said driving pulses and said modulating signal for varying the turn-on delay of said semiconductor junction laser to width modulate the coherent optical output pulses of said semiconductor junction laser.

2. The apparatus of claim 1 wherein said means for varying the turn-on delay of said semiconductor junction laser comprises a pulse amplitude modulator.

3. The apparatus of claim 1 further including means providing a positive bias to said modulating signal for preventing a reversal of signal polarity from being applied to said laser when said modulating signal swings negative.

4. The apparatus of claim 3 wherein said means for varying the turn-on delay of said semiconductor junction laser comprises first and second current limiting means for algebraically summing said driving pulses and said modulating signal.

5. The method of producing pulse width modulated coherent optical pulses comprising generating a train of pulse signals of constant amplitude and constant width, generating a modulating signal, and varying the turn-on delay of a semiconductor junction laser with said signals to width modulate the coherent output pulses of said semiconductor junction laser.

6. The method of producing pulse width modulated coherent optical pulses comprising generating a train of pulse signals of constant amplitude and constant width, modulating the amplitude of said pulse signals, and varying the turn-on delay of a semiconductor junction laser with the modulated signal.

7. The method of producing pulse width modulated coherent optical pulses of claim 5 wherein the step of energizing a semiconductor junction laser includes adding said train of pulse signals and said modulating signal and applying a positive bias to said modulating signal for preventing a reversal of signal polarity from being applied to said semiconductor junction laser when said modulating signal swings negative.

References Cited

UNITED STATES PATENTS

| | | | |
|---|---|---|---|
| 3,258,596 | 6/1966 | Green | 332—7.51 |
| 3,312,910 | 4/1967 | Offner | 332—7.51 |
| 3,341,708 | 9/1967 | Bilderback | 332—7.51 |

ROY LAKE, Primary Examiner

DARWIN R. HOSTETTER, Assistant Examiner

U.S. Cl. X.R.

331—94.5; 332—9